US009947405B2

(12) United States Patent
Strachan et al.

(10) Patent No.: US 9,947,405 B2
(45) Date of Patent: Apr. 17, 2018

(54) MEMRISTIVE DOT PRODUCT ENGINE WITH A NULLING AMPLIFIER

(71) Applicant: HEWLETT PACKARD ENTERPRISE DEVELOPMENT LP, Houston, TX (US)

(72) Inventors: John Paul Strachan, Palo Alto, CA (US); Glen E. Montgomery, Palo Alto, CA (US); Ning Ge, Palo Alto, CA (US); Miao Hu, Palo Alto, CA (US); Jianhua Yang, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/500,075

(22) PCT Filed: Nov. 18, 2014

(86) PCT No.: PCT/US2014/066195
§ 371 (c)(1),
(2) Date: Jan. 30, 2017

(87) PCT Pub. No.: WO2016/080970
PCT Pub. Date: May 26, 2016

(65) Prior Publication Data
US 2017/0249989 A1    Aug. 31, 2017

(51) Int. Cl.
*G11C 11/04*    (2006.01)
*G11C 13/00*    (2006.01)
(Continued)

(52) U.S. Cl.
CPC ............ *G11C 13/0069* (2013.01); *G01J 1/00* (2013.01); *G06G 7/16* (2013.01); *G11C 13/0021* (2013.01);
(Continued)

(58) Field of Classification Search
CPC ............ G11C 13/0069; G11C 13/0007; G11C 13/004; G11C 2213/71; G11C 11/54;
(Continued)

(56) References Cited

U.S. PATENT DOCUMENTS 6,501,697 B1    12/2002    Perner et al.
8,416,604 B2    4/2013    Kim et al.
(Continued)

FOREIGN PATENT DOCUMENTS

WO    WO-2014018063 A1    1/2014
WO    WO-2014109771 A1    7/2014

OTHER PUBLICATIONS

International Searching Authority, The International Search Report and the Written Opinion, PCT/US2014/066195, Aug. 4, 2015, 12 Pages.

Truong, S.N. et al., New Memristor-based Crossbar Array Architecture with 50-% Area Reduction and 48-% Power Saving for Matrix-vector Multiplication of Analog Neuromorphic Computing, Jun. 2014, Journal of Semiconductor Technology and Science, vol. 14, No. 3, pp. 356-363.

*Primary Examiner* — Thong Q Le
(74) *Attorney, Agent, or Firm* — Fabian VanCott

(57) ABSTRACT

A method of obtaining a dot product using a memristive dot product engine with a nulling amplifier includes applying a number of programming voltages to a number of row lines within a memristive crossbar array to change the resistance values of a corresponding number of memristors located at intersections between the row lines and a number of column lines. The method also includes applying a number of reference voltages to the number of the row lines and applying a number of operating voltages to the number of the row lines. The operating voltages represent a corresponding number of vector values. The method also includes determining an array output based on a reference output and an operating output collected from the number of column lines.

20 Claims, 7 Drawing Sheets

(51) Int. Cl.
*G01J 1/00* (2006.01)
*G06G 7/16* (2006.01)

(52) U.S. Cl.
CPC .. *G11C 2013/0088* (2013.01); *G11C 2213/77* (2013.01)

(58) Field of Classification Search
CPC .............. G11C 13/0023; G11C 13/003; G11C 2213/32; G11C 11/21; G11C 13/0064; G11C 13/02; G11C 13/04; G11C 11/5614
USPC ......... 365/148, 51, 130, 135, 139, 163, 185, 365/185.13, 63, 149, 154, 158, 175, 180, 365/182, 185.05
See application file for complete search history.

(56) References Cited

U.S. PATENT DOCUMENTS

| | | |
|---|---|---|
| 2006/0050584 A1 | 3/2006 | Gogl et al. |
| 2012/0014175 A1 | 1/2012 | Wang et al. |
| 2012/0175583 A1 | 7/2012 | Nugent |
| 2013/0028004 A1 | 1/2013 | Snider |
| 2014/0043911 A1 | 2/2014 | Samachisa et al. |
| 2014/0172937 A1* | 6/2014 | Linderman ............. G06G 7/16 708/607 |

* cited by examiner

MEMRISTIVE DOT PRODUCT ENGINE WITH A NULLING AMPLIFIER

BACKGROUND

Resistive memory elements often referred to as memristors are devices that may be programmed to different resistive states by applying electrical voltage or currents to the memristors. After programming, the state of the memristors may be read. The state of the memristors remains stable long enough to regard the device as non-volatile. A number of memristors may be included within a crossbar array in which a number of column lines intersect with a number of row lines, the memristors being located at the intersection of a column line and a row line.

BRIEF DESCRIPTION OF THE DRAWINGS

The accompanying drawings illustrate various examples of the principles described herein and are a part of the specification. The illustrated examples are given merely for illustration, and do not limit the scope of the claims.

Throughout the drawings, identical reference numbers designate similar, but not necessarily identical, elements.

DETAILED DESCRIPTION

Figure 1:
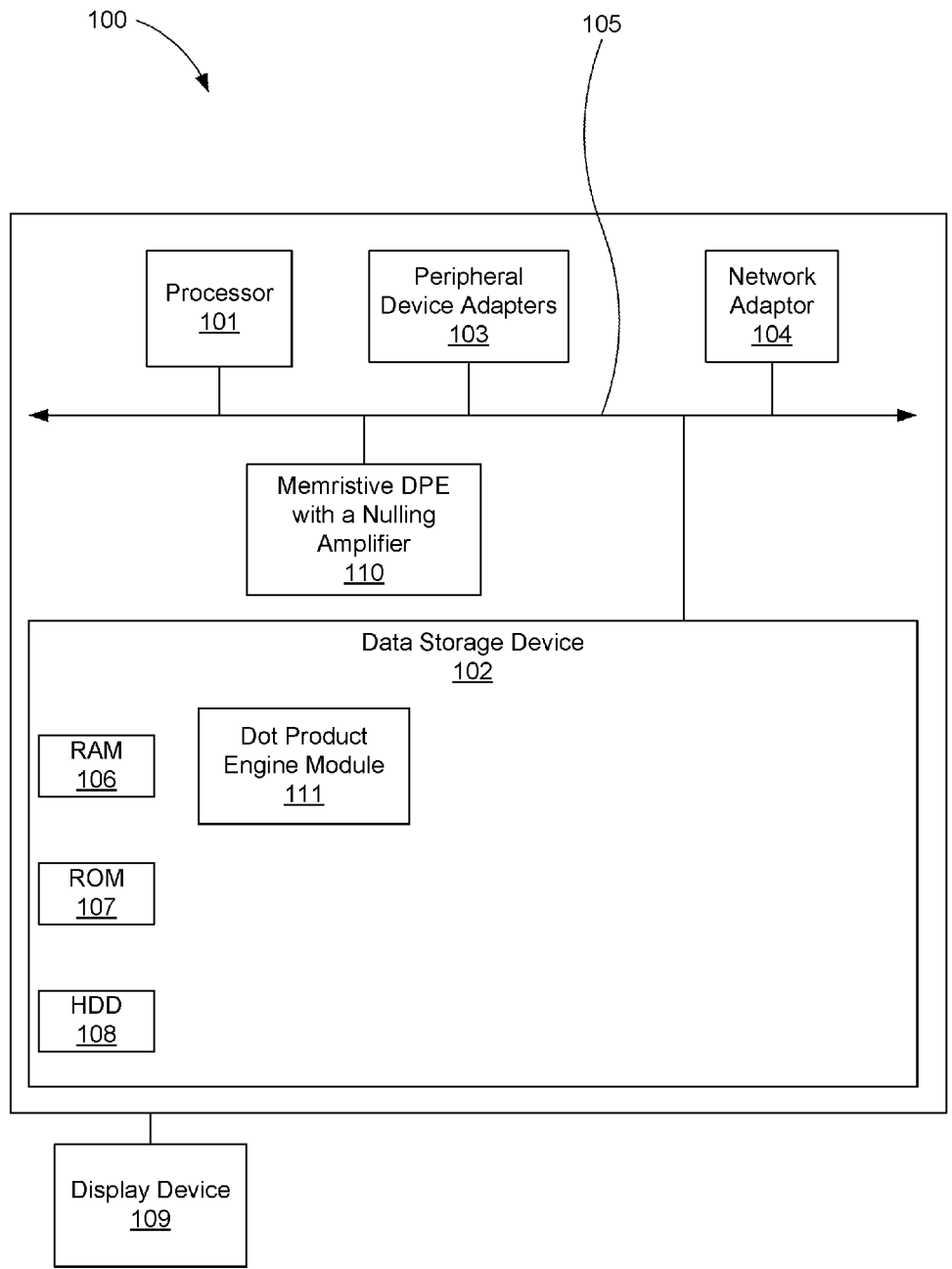
FIG. 1 is a diagram of a computing system for determining a dot product, according to one example of the principles described herein.

Crossbar arrays of memristors may be used in a variety of applications, including non-volatile solid state memory, programmable logic, signal processing, control systems, pattern recognition, and other applications. The present application is directed to a memristive crossbar array used to determine a dot product of, for example, a number of input matrix values and a number of input vector values. In other words, a memristive crossbar array can be used to perform vector-matrix or dot product computations. For example, an input voltage signal along each row of the crossbar array is weighted by the resistance of the memristive devices in each column and accumulated as the current output from each column. Accordingly, the memristive crossbar array includes a number of row lines and a number of column lines intersecting the row lines. Memristive memory devices are coupled between the row lines and the column lines at the intersections. The memristive crossbar array is coupled to a nulling amplifier to determine an array output based on a reference voltage and an operating voltage.

A specific example is given as follows. The memristive memory elements receive a number of programming signals along row lines. The programming signals represent a number of values within a matrix that are to be multiplied by a vector input. The memristive memory elements also receive a number of reference vector signals along the row lines to generate a reference output along a column line. During operation, an operating vector signal is passed along the row lines, the operating vector signal representing a vector input to be multiplied by the matrix. An output current for each column is determined from Ohm's law using the resistance of the memristor and a voltage of the vector input. In determining the output, a nulling amplifier located on each column line generates a column output by subtracting the reference output for a column from an operating output for the column. A collection line is coupled to the output of each column line to collect all column outputs and combine them into an array output. The array output equals a dot product of the matrix values and vector values.

Including a nulling amplifier in a memristive dot product engine may be beneficial by accounting for the varied resistances that the memristors in the crossbar array exhibit. For example, the analog memristors in the crossbar array are capable of exhibiting a number of resistance levels, differing by as much as $10^8$ ohms in some cases. These varied resistance levels may lead to a wide range of output currents at each column, which leads to a low resolution output value. Accordingly, by determining a reference output, and subtracting the reference output from an operating output, a more appropriate, higher resolution output is obtained.

The present disclosure describes a memristive dot product engine including a memristive crossbar array with a nulling amplifier for determining a dot product. The array includes a number of row lines and a number of column lines intersecting the row lines. A memristive memory element is located at each intersection of a row line and a column line. Each memristive memory element receives 1) a programming signal to represent a number of values within a matrix, 2) a reference vector signal, and 3) an operating vector signal to represent a number of vector values to be multiplied by the matrix. The array is coupled to a nulling amplifier to determine an array output from 1) a reference output which is based on the reference vector signal and 2) an operating output which is based on the operating vector signal. The array output represents a dot product of the matrix values and the vector values.

The present disclosure describes a method of obtaining a dot product using a memristive dot product engine with a nulling amplifier. The method includes applying a number of programming voltages to a number of row lines within a memristive crossbar array to change the resistance values of a corresponding number of memristors located at intersections between the row lines and a number of column lines. The method also includes applying a number of reference voltages to the number of the row lines and applying a number of operating voltages to the number of the row lines. The operating voltages representing a corresponding number of vector values. The method also includes determining an array output based on a reference output and an operating output collected from the number of column lines.

The present disclosure describes a computing device for determining a dot product using a memristive dot product engine with a nulling amplifier. The device includes a processor and a memristive crossbar array coupled to the processor. The memristive crossbar array includes a number of row lines and a number of column lines intersecting the row lines. A memristive memory element is located at each intersection of a row line and a column line. Each memristive element receives 1) a programming vector signal to represent a value within a matrix, 2) a reference vector signal, and 3) an operating vector signal to represent a vector value to be multiplied by the matrix. The device also includes a nulling amplifier to 1) determine a reference output along each column line based on a number of reference vector signals, 2) determine an operating output along each column line based on a number of operating vector signals, and 3) determine an array output by subtracting the reference outputs from the operating outputs.

As used in the present specification and in the appended claims, the term "memristor" may refer to a passive two-terminal circuit element that maintains a functional relationship between the time integral of current, and the time integral of voltage.

Further, as used in the present specification and in the appended claims, the term "dot product" is meant to be understood broadly as the product of two vectors to form a scalar, whose value is the product of the magnitudes of the vectors and the cosine of the angle between them. In one example, the vectors may be represented as matrices that may be multiplied to obtain the dot product. Other names for dot product include scalar product and inner product. A dot product calculation is a computationally expensive task for a digital computer. This may be especially true when the matrices are not sparse or symmetric, such as in the case of dense matrices. A symmetric matrix is a square matrix that is equal to its transpose. Sparse matrices are matrices in which most of the elements are zero. In contrast, if most of the elements in the matrix are nonzero, then the matrix is considered dense.

Still further, as used in the present specification and in the appended claims, the term "memristive dot product engine" is meant to be understood broadly as a dot product engine that includes a memristive crossbar array.

Even further, as used in the present specification and in the appended claims, the term "a number of" or similar language is meant to be understood broadly as any positive number including 1 to infinity; zero not being a number, but the absence of a number.

In the following description, for purposes of explanation, numerous specific details are set forth in order to provide a thorough understanding of the present systems and methods. It will be apparent, however, to one skilled in the art that the present apparatus, systems, and methods may be practiced without these specific details. Reference in the specification to "an example" or similar language means that a particular feature, structure, or characteristic described in connection with that example is included as described, but may not be included in other examples.

Turning now to the figures, FIG. 1 is a diagram of a computing system (100) for determining a dot product, according to one example of the principles described herein. The computing system (100) may be implemented in an electronic device. Examples of electronic devices include servers, desktop computers, laptop computers, personal digital assistants (PDAs), mobile devices, smartphones, gaming systems, and tablets, among other electronic devices.

The computing system (100) may be utilized in any data processing scenario including, stand-alone hardware, mobile applications, through a computing network, or combinations thereof. Further, the computing system (100) may be used in a computing network, a public cloud network, a private cloud network, a hybrid cloud network, other forms of networks, or combinations thereof. In one example, the methods provided by the computing system (100) are provided as a service over a network by, for example, a third party. In this example, the service may include, for example, the following: a Software as a Service (SaaS) hosting a number of applications; a Platform as a Service (PaaS) hosting a computing platform including, for example, operating systems, hardware, and storage, among others; an Infrastructure as a Service (IaaS) hosting equipment such as, for example, servers, storage components, network, and components, among others; application program interface (API) as a service (APIaaS), other forms of network services, or combinations thereof. The present systems may be implemented on one or multiple hardware platforms, in which the modules in the system can be executed on one or across multiple platforms. Such modules can run on various forms of cloud technologies and hybrid cloud technologies or offered as a SaaS (Software as a service) that can be implemented on or off the cloud. In another example, the methods provided by the computing system (100) are executed by a local administrator.

To achieve its desired functionality, the computing system (100) includes various hardware components. Among these hardware components may be a number of processors (101), a number of data storage devices (102), a number of peripheral device adapters (103), and a number of network adapters (104). These hardware components may be interconnected through the use of a number of busses and/or network connections. In one example, the processor (101), data storage device (102), peripheral device adapters (103), and a network adapter (104) may be communicatively coupled via a bus (105).

The processor (101) may include the hardware architecture to retrieve executable code from the data storage device (102) and execute the executable code. The executable code may, when executed by the processor (101), cause the processor (101) to implement at least the functionality of applying a number of programming voltages to a number of row lines within a memristive crossbar array to change the resistance values of a corresponding number of memristors located at intersections between the row lines and a number of column lines. The executable code may, when executed by the processor (101), also cause the processor (101) to implement at least the functionality of applying a number of reference voltages to the number of row lines. The executable code may, when executed by the processor (101), also cause the processor (101) to implement at least the functionality of applying a number of operating voltages to the number of row lines, the operating voltages representing a corresponding number of vector values. The executable code may, when executed by the processor (101), also cause the processor (101) to implement at least the functionality of determining an array output based on a reference output and an operating output collected from the number of column lines. The functionality of the computing system (100) is in accordance to the methods of the present specification described herein. In the course of executing code, the processor (101) may receive input from and provide output to a number of the remaining hardware units.

The data storage device (102) may store data such as executable program code that is executed by the processor (101) or other processing device. As will be discussed, the data storage device (102) may specifically store computer code representing a number of applications that the processor (101) executes to implement at least the functionality described herein.

The data storage device (102) may include various types of memory modules, including volatile and nonvolatile memory. For example, the data storage device (102) of the present example includes Random Access Memory (RAM) (106), Read Only Memory (ROM) (107), and Hard Disk Drive (HDD) memory (108). Many other types of memory may also be utilized, and the present specification contemplates the use of many varying type(s) of memory in the data storage device (102) as may suit a particular application of the principles described herein. In certain examples, different types of memory in the data storage device (102) may be used for different data storage needs. For example, in certain examples the processor (101) may boot from Read Only Memory (ROM) (107), maintain nonvolatile storage in the Hard Disk Drive (HDD) memory (108), and execute program code stored in Random Access Memory (RAM) (106).

The data storage device (102) may include a computer readable medium, a computer readable storage medium, or a non-transitory computer readable medium, among others. For example, the data storage device (102) may be, an electronic, magnetic, optical, electromagnetic, infrared, or semiconductor system, apparatus, or device, or any suitable combination of the foregoing. More specific examples of the computer readable storage medium may include, for example, the following: an electrical connection having a number of wires, a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage medium may be any tangible medium that can contain, or store computer usable program code for use by or in connection with an instruction execution system, apparatus, or device. In another example, a computer readable storage medium may be any non-transitory medium that can contain, or store a program for use by or in connection with an instruction execution system, apparatus, or device.

The hardware adapters (103, 104) in the computing system (100) enable the processor (101) to interface with various other hardware elements, external and internal to the computing system (100). For example, the peripheral device adapters (103) may provide an interface to input/output devices, such as, for example, display device (109), a mouse, or a keyboard. The peripheral device adapters (103) may also provide access to other external devices such as an external storage device, a number of network devices such as, for example, servers, switches, and routers, client devices, other types of computing devices, and combinations thereof.

The display device (109) may be provided to allow a user of the computing system (100) to interact with and implement the functionality of the computing system (100). The peripheral device adapters (103) may also create an interface between the processor (101) and the display device (109), a printer, or other media output devices. The network adapter (104) may provide an interface to other computing devices within, for example, a network, thereby enabling the transmission of data between the computing system (100) and other devices located within the network.

The computing system (100) may, when executed by the processor (101), display the number of graphical user interfaces (GUIs) on the display device (109) associated with the executable program code representing the number of applications stored on the data storage device (102). The GUIs may display, for example, interactive screenshots that allow a user to interact with the computing system (100) to input matrix and vector values in association with a memristive dot product engine (DPE) with a nulling amplifier (110) as will be described in more detail below. Additionally, via making a number of interactive gestures on the GUIs of the display device (109), a user may obtain a dot product value based on the input data. Examples of display devices (109) include a computer screen, a laptop screen, a mobile device screen, a personal digital assistant (PDA) screen, and a tablet screen, among other display devices (106).

The computing system (100) may further include a memristive dot product engine (DPE) with a nulling amplifier (110). As will be described in more detail below, the memristive DPE (110) includes a number of elements including a number of memristors that function together within an array to perform a dot product of matrix values with an input vector. The memristive DPE with a nulling amplifier (110) may be used in a number of applications. For example, the memristive DPE with a nulling amplifier (110) may be used as a threshold logic gate (TLG) to perform a matrix product to compare the output with a threshold. Thus, the memristive DPE with a nulling amplifier (110) may be used as an accelerator in which the memristive DPE with a nulling amplifier (110) performs a number of functions faster than is possible for operations running on a more general-purpose processing device. Although the memristive DPE with a nulling amplifier (110) is depicted as being a device internal to the computing system (100), in another example, the memristive DPE with a nulling amplifier (110) may be a peripheral device coupled to the computing system (100) or included within a peripheral device coupled to the computing system (100).

The computing system (100) further includes a number of modules used in the implementation of the systems and methods described herein. The various modules within the computing system (100) include executable program code that may be executed separately. In this example, the various modules may be stored as separate computer program products. In another example, the various modules within the computing system (100) may be combined within a number of computer program products; each computer program product including a number of the modules.

The computing system (100) may include a dot product engine module (111) to, when executed by the processor (101), assist in the functionality of the memristive DPE with a nulling amplifier (110). The dot product engine module (111), for example, receives a number of input values representing a matrix to be processed in a dot product mathematical calculation. The dot product engine module (111) may send the input values to the memristive DPE with a nulling amplifier (110) as programming signals to a number of memristors within the memristive array of the DPE (110) to program the memristors. The dot product engine module (111) may also receive a reference vector input and an operating vector input to be processed in connection with the matrix programmed into the memristors. The dot product engine module (111) may further obtain a value representing the dot product, and convey that value as data to the computing system (100) or another computing device for analysis or further processing.

Figure 2:
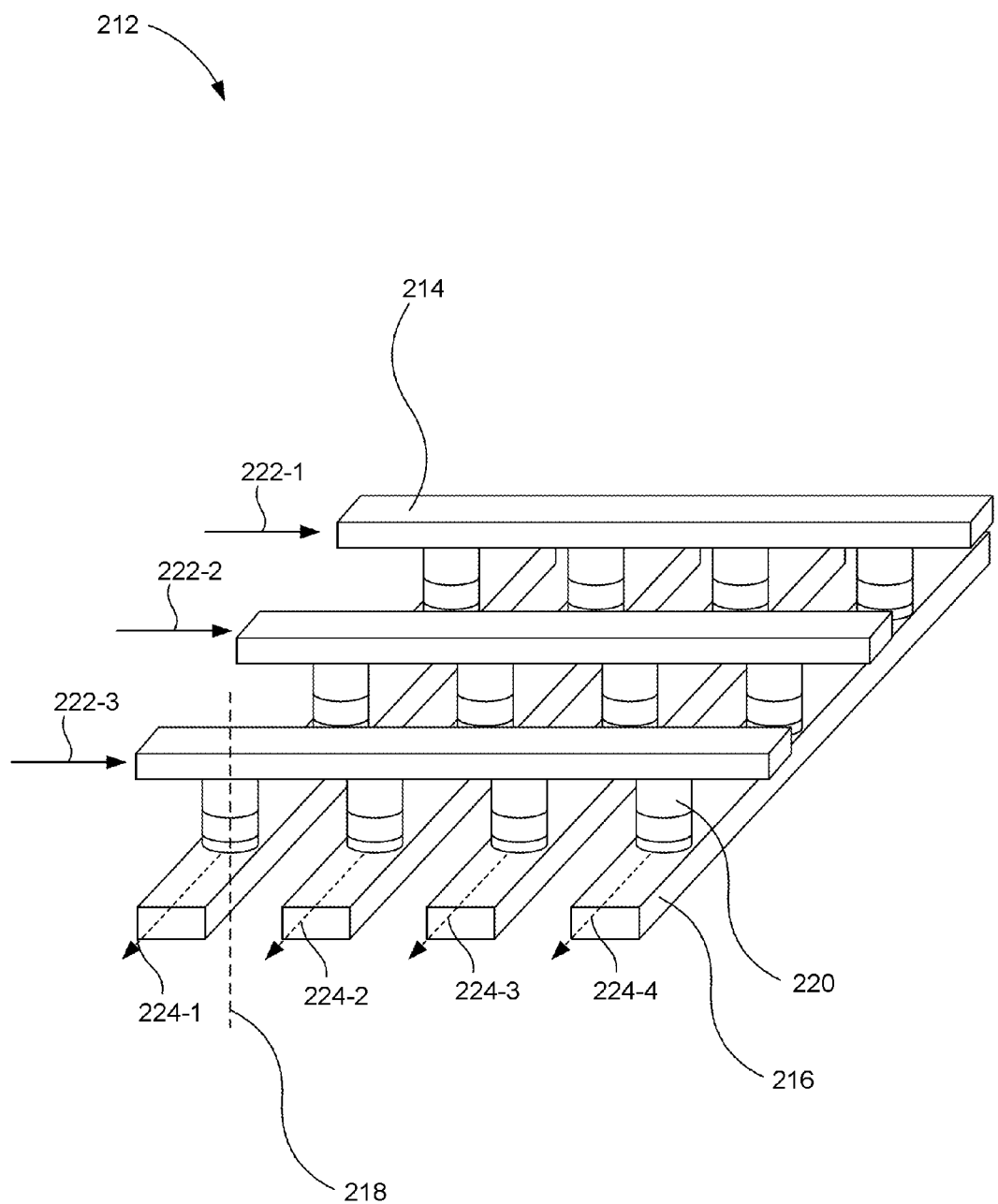
FIG. 2 is a diagram of a memristive crossbar array used within the memristive dot product engine (DPE) with a nulling amplifier of the computing system of FIG. 1, according to one example of the principles described herein.

FIG. 2 is a diagram of a memristive crossbar array (212) used within the memristive dot product engine (DPE) with a nulling amplifier (FIG. 1, 110) of the computing system (FIG. 1, 100) of FIG. 1, according to one example of the principles described herein. The memristive crossbar array (212) may include a number of electrically conductive row lines (214) and a number of electrically conductive column lines (216). Even though three row lines (214) and four column lines (216) are depicted in FIG. 2, any number of row lines (214) and column lines (216) may be present in the memristive crossbar array (212). The row lines (214) and column lines (216) intersect at junctions as indicated by the dashed line (218). A number of memristive memory devices or "memristors" (220) are located at the junctions (218) and electrically couple the row lines (214) to the column lines (216).

Memristance is a property of the electronic component referred to as a memristor (220). If charge flows in one direction through a circuit, the resistance of that component of the circuit will increase. If charge flows in the opposite direction in the circuit, the resistance will decrease. If the flow of charge is stopped by turning off the applied voltage, the component will "remember" the last resistance that it had, and when the flow of charge starts again the resistance of the circuit will be what it was when it was last active. A memristor (220) is a resistor device whose resistance can be changed.

The conductance channels in the memristors (220) may be formed in each of the memristors (220) and the memristors (220) may be individually addressed as bits. A crossbar is an array of switches that connect each wire in one set of parallel wires to every member of a second set of parallel wires that intersects the first set. In the example of FIG. 2, the row lines (214) and the column lines (216) are perpendicular with respect to each other, but the row lines (214) and the column lines (216) may intersect at any angle.

The memristors (220) may be built at the micro- or nano-scale and used as a component in a wide variety of electronic circuits, such as, bases for memories and logic circuits. When used as a basis for memories, the memristors (220) may be used to store a bit of information, 1 or 0. When used as a logic circuit, as described herein, the memristors (220) may be employed to represent bits in a field programmable gate array, as the basis for a wired-logic programmable logic array, or, as described herein, as a dot product engine. The memristors (220) disclosed herein may also find use in a wide variety of other applications. The memristors (220) may be fabricated through any reasonably suitable fabrication process, such as, for example, chemical vapor deposition, sputtering, etching, lithography, or other methods of forming memristors.

The memristive crossbar array (212) may be used in matrix multiplication. For example, the resistance values of memristors (220) within the crossbar array (212) may represent matrix values to be multiplied. An operating voltage may be passed along each row line, the combination of operating voltages representing a vector of values to be multiplied by the matrix values (i.e., the conductance of the memristors (220)). The dot product of the matrix and vector may be replicated by multiplying the resistance (represented as a conductance) of each memristor (220) by the input vector voltages, and collecting the outputs along column lines (216) of the memristive crossbar array (212) as currents. For example, the output of a particular column line (216) may be indicated by the following relationship:

$$V_{out\_j} = -R_f \sum_i V_{in\_i} \times \frac{1}{R_{ij}}.$$ Equation 1

In Equation 1, $V_{out\_j}$ represents the output voltage at a column line (216) "j," $R_f$ represents a resistance of a sensing circuit at the output (224-1, 224-2, 224-3, 224-4), $V_{in\_j}$ represents an input operating voltage at a row line (214) "i," and $R_{ij}$ represents a resistance of a memristor (200) such that $1/R_{ij}$ represents a conductance value of the memristors (220) at row "i" and column "j." Each output (224) may be combined, either as a vector, or a scalar value to indicate a dot product of the matrix with the input vector.

To effectuate the matrix multiplication, each memristor (220) may receive a number of input signals. Specifically, each row line (214) may receive a programming vector signal, a reference vector signal, and an operating vector signal. For simplicity, in FIG. 2 a single line (222) is used to represent the various input vector signals. More specifically, a first line (222-1) indicates a first programming vector signal, a first reference vector signal, and a first operating vector signal. Similarly, a second and third line (222-2, 222-3) represent second and third programming vector signals, reference vector signals, and operating vector signals, respectively.

A programming vector signal may be used to change the resistance values at each individual memristor (220) at each junction in the crossbar array (212) to create a representation (e.g., a mapping) of a mathematic matrix in which each resistance value at each memristor (220) represents a value within the matrix. This change in resistance among the individual memristors (220) is an analog change from a low-to-high value or a high-to-low value. In this manner, the memristors (220) are "memory resistors" in that they "remember" the last resistance that they had. In one example, an initial signal may be applied to the memristors (220) before application of the programming vector signals and the vector signals in order to set the resistivity of the memristors (220) to a predetermined value. The memristors (220) within the crossbar array (212) may be set to any number of resistance levels. For example, some memristors (220) may be set to a resistance level of approximately 1,000 ohms (Ω) while other memristors (220) may be set to a resistance level of approximately 1,000,000Ω. Using a programming vector signal to set the memristors (220) to different resistance levels creates a mapping between a matrix of values and the resistance level. For example distinct resistance levels may represent distinct values in a matrix.

Each memristor (220) may also receive a reference vector signal from which a baseline output for each column line (216) is determined. For example, as described above memristors (220) within an array (212) may take on various resistance levels, these varying resistance levels may lead to a wide range of outputs, i.e., currents measured along column lines (216). Accurately detecting such a wide range of currents may be computationally expensive, complex, and imprecise. Accordingly, from a reference vector signal, a reference output for a column line (216) may be determined, based on the resistance of the memristors (220) and other characteristics of the array (212), and this reference output is subtracted during a dot product operation to account for the variation in memristor (220) resistances. In other words, via the reference vector signal and the resultant reference output, the crossbar array (212) may be zeroed to account for the characteristics of the array (212), and thereby may generate a higher resolution, and more accurate output measurement.

Additionally, the operating vector signals across the different row lines (214) may be relatively similar such that variations between the different operating signal vectors are relatively small. Accordingly, a narrower, more "zoomed in," output window may be generated by subtracting a portion of the operating vector signal that is common to all row lines (214). The reference vector signal allows for the common portion of the operating vector signals to be subtracted such that a higher resolution output may be generated.

An operating vector signal may be used to multiply a matrix value by a vector value at each memristor (220) involved in the calculation. The operating vector signals may be applied to the row lines (214) of the memristive crossbar array (212). The operating vector signals may represent a vector to be multiplied by the matrix values, which matrix values are represented by the memristor (220) resistances set by the programming vector signals. In one example, the operating vector signals have a relatively lower voltage value than the programming vector signals used to program the memristors (220) such that the voltage level applied by the operating vector signals does not change the resistance values of the memristors (220) as programmed by the programming vector signals. The operating vector signals act as read signals in this manner by not changing the resistance values of the memristors (220).

As will be described in more detail in FIG. 3, the reference vector signals and operating vector signals interact with the memristors (220) and a resulting output (224) is collected at the end of each column line (216).

Figure 3:
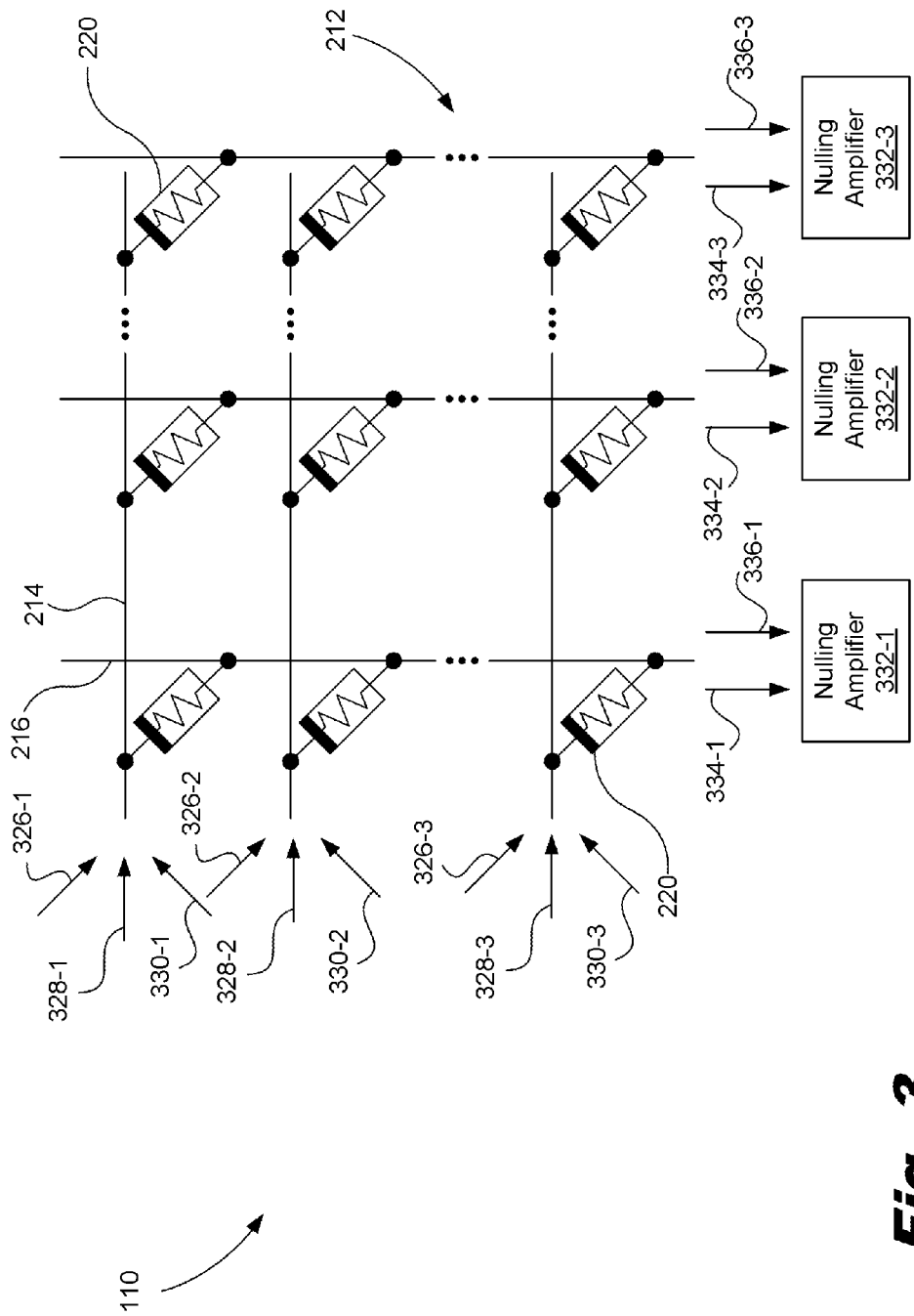
FIG. 3 is a diagram of the memristive dot product engine (DPE) with a nulling amplifier of FIGS. 1 and 2, according to one example of the principles described herein.

FIG. 3 is a diagram of the memristive dot product engine (DPE) having a nulling amplifier (110) of FIGS. 1 and 2, according to one example of the principles described herein. Although the memristive DPE with a nulling amplifier (110) of FIG. 3 is depicted as having a circuit layout as depicted, any number of circuit layouts may be used to achieve the function of the present systems and methods. The memristive array (212) as depicted in FIG. 3 includes the row lines (214), the column lines (216), and the memristors (220) as described above in connection with FIG. 2. As mentioned above, any number of row lines (214) and column lines (216) may be included within the memristive DPE (110). In one example, the number of row lines (214) and column lines (216) included within the memristive DPE (110) may be equal or greater than the size of the matrix of the dot product to be calculated using the systems and methods described herein.

As described above, the memristive array (212) of the DPE (110) may receive a number of different input vector signals (FIG. 2, 222). Accordingly, the memristive crossbar array (212) may include a number of row circuits connected to each row line (214) to apply the programming vector signal (326), the reference vector signal (328), the operating vector signal (330), or combinations thereof.

A programming signal (326-1, 326-2, 326-3) may be applied to each row line (214), the programming signal (326) being a signal to set the resistance levels of the memristors (220) in a corresponding row line (214) to values that correspond with matrix entries of a matrix to be used in generating a dot product. In this fashion, the resistance levels of the memristors (220) may form a grid of values that map to a matrix of entry values that are to be multiplied by a vector, i.e., the input vector.

A reference vector signal (328-1, 328-2, 328-3) may also be applied to each row line (214). The reference vector signal (328) may be used to generate a reference output for each column line (216) as will be described below. The reference output may reflect a number of characteristics of columns of memristors (220). In some examples the reference vector signals (328) may be a similar value that is selected based on the operating vector signals (330) to be passed to the array (110). For example, the reference vector signals (328) may be a statistical median of the different operating vector signals (330) that are to be subsequently passed to the memristive crossbar array (212). While specific reference is made to a statistical median being used as the reference vector signal (328) and is applied to each row line (214), different reference vector signals (328) may be passed to each row line (214), each reference vector signal (328) having any value.

The crossbar array (212) may also receive a number of operating vector signals (330-1, 330-2, 330-3) that represent vector values of an input vector that is to be multiplied by the matrix represented by the programming vector signals (326). As will be described below, the operating vector signals (330) may be used to determine the operating outputs of the individual column lines (216).

Figure 4A:
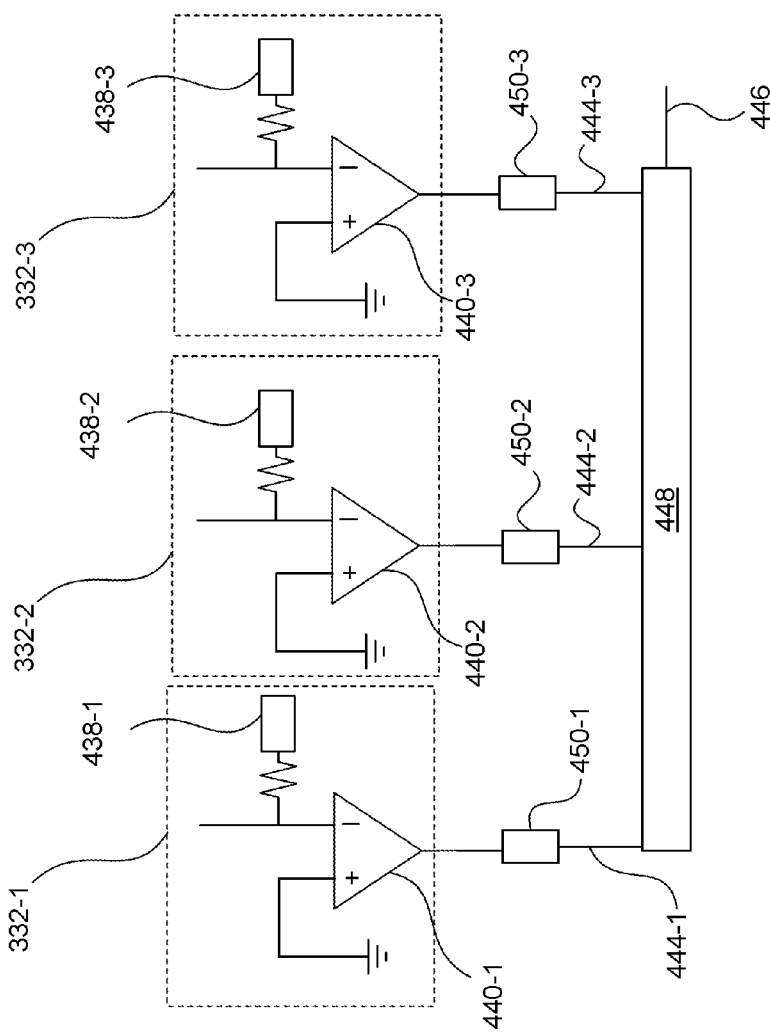
FIGS. 4A and 4B are circuit diagrams of a number of nulling amplifiers according to one example of the principles described herein.
Figure 4B:
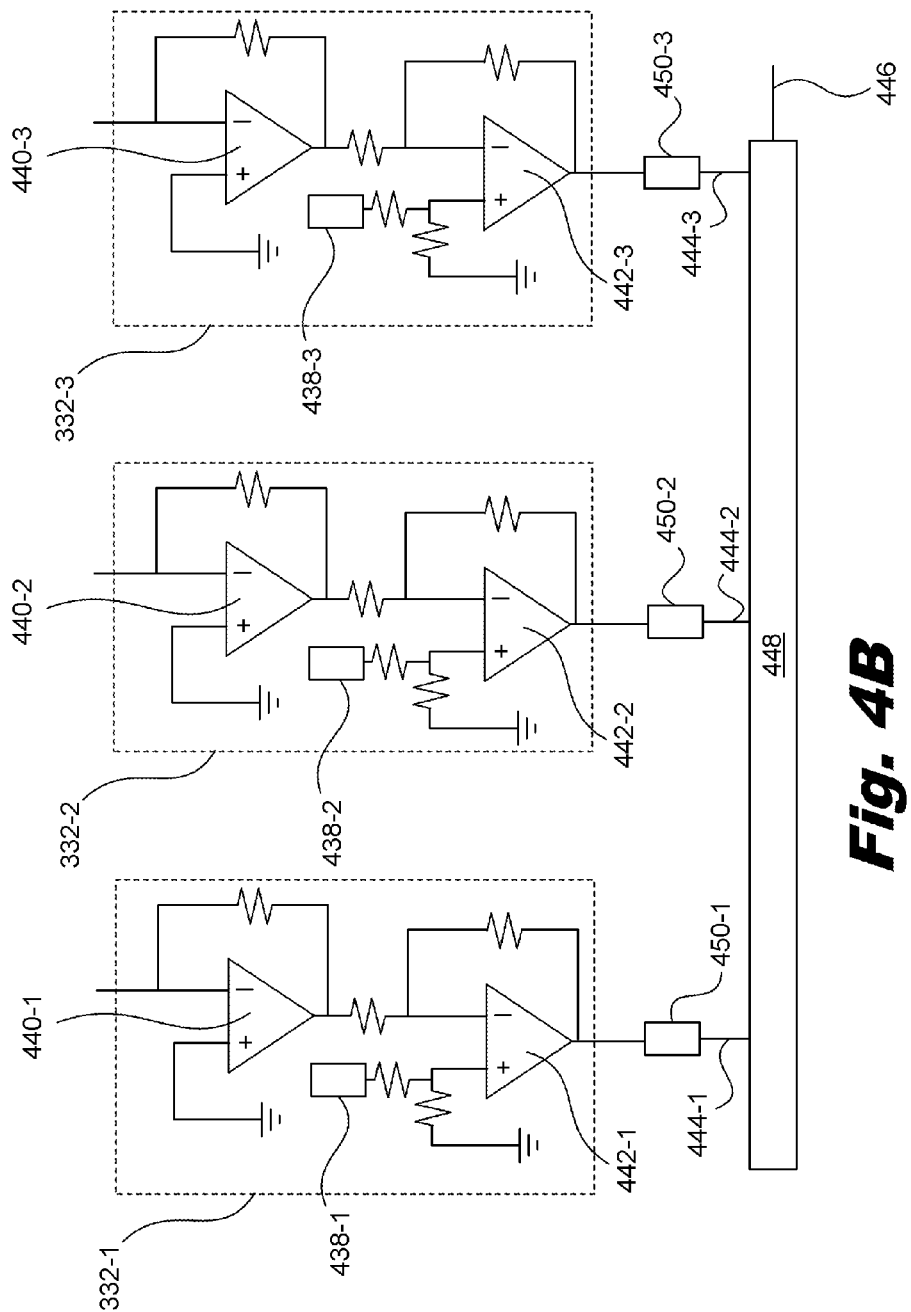

The memristive crossbar array (212) may be coupled to a number of nulling amplifiers (332-1, 332-2, 332-3), the nulling amplifiers (332) being represented by boxes in FIG. 3. FIGS. 4A and 4B described below provide specific examples of nulling amplifiers (332). Returning to FIG. 3, each column line (216) may have a corresponding nulling amplifier (332). A nulling amplifier (332) may determine a column output for a column of memristors (220). For example, using Ohm's law, the operating vector signal (330) may be multiplied by the resistance levels (as conductance levels for example) of the memristors (220), to yield an output current for a column. Each nulling amplifier (332) may also amplify the output current for each column. The outputs of the various nulling amplifiers (332) may yield a vector that is indicative of the result of a dot product calculation. In determining a column output, each nulling amplifier (332) may receive at least two signals from the memristive crossbar array (212). Accordingly, the memristive crossbar array (212) may include a number of column circuits connected to each column line (216) to collect the reference output (334), the operating output (336), or combinations thereof.

First, the nulling amplifiers (332) may receive a reference output (334-1, 334-2, 334-3) along the number of column lines (216). The reference outputs (334) may form a baseline value that may be subtracted from an operating output (336) to generate a column output. The reference output (334) may represent a sum of the individual output values from memristors (220) in a corresponding column line (216) in response to a reference vector signal (328). For example, as mentioned above, the reference vector signals (328) interact with the memristors (220) at their respective junctions (FIG. 2, 218), to generate a current output per memristor (220). The reference output (334) for a particular column line (216) may be the sum of current outputs from corresponding memristors (220). The current output for a column may be converted to a voltage. For example, the reference output (334) as a voltage may be represented by the relationship indicated in Equation 2.

$$V_{rout\_j} = -R_f \sum_i V_{rin\_i} \times \frac{1}{R_{ij}}. \qquad \text{Equation 2}$$

In Equation 2, $V_{rout\_j}$ indicates the reference output (334) as a voltage at column line (216) "j" and $V_{rin\_i}$ indicates the reference vector signal (328) at a row line (214) "i."

Each nulling amplifier (332) may also receive an operating output (336-1, 336-2, 336-3) along the number of column lines (216). The operating outputs (336) may represent a sum of the individual operating output values from memristors (220) in a corresponding column line (216) in response to an operating vector signal (330). For example, as mentioned above, the operating vector signals (330) interact with the memristors (220) at their respective junctions (FIG. 2, 218), to generate a current output per memristor (220). The operating output (336) for a particular column line (216) may be the sum of current outputs from corresponding memristors (220). Similar to the reference output (334), the operating current output for a column may be converted to a voltage. For example, the operating output (336) as a voltage may be represented by the relationship indicated in Equation 3.

$$V_{oout\_j} = -R_f \sum_i V_{oin\_i} \times \frac{1}{R_{ij}}.$$  Equation 3

In Equation 3, $V_{oout\_j}$ indicates the operating output (336) as a voltage at column line (216) "j" and $V_{oin\_i}$ indicates the operating vector signal (330) at a row line (214) "i."

Each nulling amplifier (332) may subtract the corresponding reference output (334) from the corresponding operating output (336) to form a column output which is combined with other column outputs to form an array output that represents a dot product of the matrix values and the vector values. By subtracting the reference output (334) from the operating output (336), the array output has been zeroed based on the reference outputs (334).

FIGS. 4A and 4B are circuit diagrams of a number of nulling amplifiers (332) according to one example of the principles described herein. As described above, each nulling amplifier (332) may receive a reference output (FIG. 3, 334) and an operating output (FIG. 3, 336). In some examples, the reference output (FIG. 3, 334) may be a reference current, and the operating output (FIG. 3, 336) may be an operating current. In this example, each nulling amplifier (332) may subtract the reference current from the output current. FIG. 4A depicts an example of a circuit that may carry out this functionality. Although FIG. 4A depicts a particular circuit layout, any number of circuit layouts may be used to achieve the function of subtracting a reference current from an operating current. In some examples, a nulling amplifier (332) may include a storage component (438-1, 438-2, 438-3) to store the reference current. In FIGS. 4A and 4B, the storage component (438) is represented as a box and may include any number of circuit elements to store the reference current. For example, the storage component (438) may be a capacitor that stores the reference current when it is received.

During operation, the reference current is subtracted from the operating current. Each nulling amplifier (332) may also include a transimpedance amplifier (TIA) (440-1, 440-2, 440-3) to convert the current output to a voltage. The TIA (440) may also amplify the current output of the memristive DPE (FIG. 1, 110) to a usable voltage. In addition to passing through a TIA (440), each output may also pass through an additional column amplifier (450-1, 450-2, 450-3) to further amplify each output to a desired level. In FIGS. 4A and 4B, the column amplifiers (450) are represented as boxes and may include any number of circuit elements to amplify each output.

The column line (FIG. 2, 216) outputs (444-1, 444-2, 444-3), which may be voltages, may be collected to generate an array output (446). The array output (446) represents the dot product of the matrix values and vector values. As depicted in FIG. 4A, the column outputs (444) may be passed through a conversion circuit (448).

In some examples, the reference output (FIG. 3, 334) may be a reference voltage, and the operating output (FIG. 3, 336) may be an operating voltage. In this example, each nulling amplifier (332) may subtract the reference voltage from the output voltage. FIG. 4B depicts an example of a circuit that may carry out this functionality. Although FIG. 4B depicts a particular circuit layout, any number of circuit layouts may be used to achieve the function of subtracting a reference voltage from an operating voltage. In some examples, a nulling amplifier (332) may include a storage component (438) to store the reference voltage. For example, a reference current may be received for a column line (FIG. 2, 216). A transimpedance amplifier (TIA) (440) converts the reference current to a reference voltage and a storage component (438), such as a capacitor, stores the converted reference voltage. The TIA (440) may also amplify the output of the nulling memristor array (FIG. 1, 110) to a usable voltage. During operation, the reference voltage would be subtracted from the operating voltage. For example, the output voltage may then be passed to another amplifier (442-1, 442-2, 442-3) that subtracts the reference voltage from the operating voltage and further amplifies the output voltage. Each output may also pass through an additional column amplifier (450-1, 450-2, 450-3) to further amplify each output to a desired level.

The column line (FIG. 2, 216) outputs (444), which may be voltages, may be collected to generate an array output (446). The array output (446) represents the dot product of the matrix values and vector values. As depicted in FIG. 4B, the column outputs (444) may be passed through a conversion circuit (448).

Figure 5:
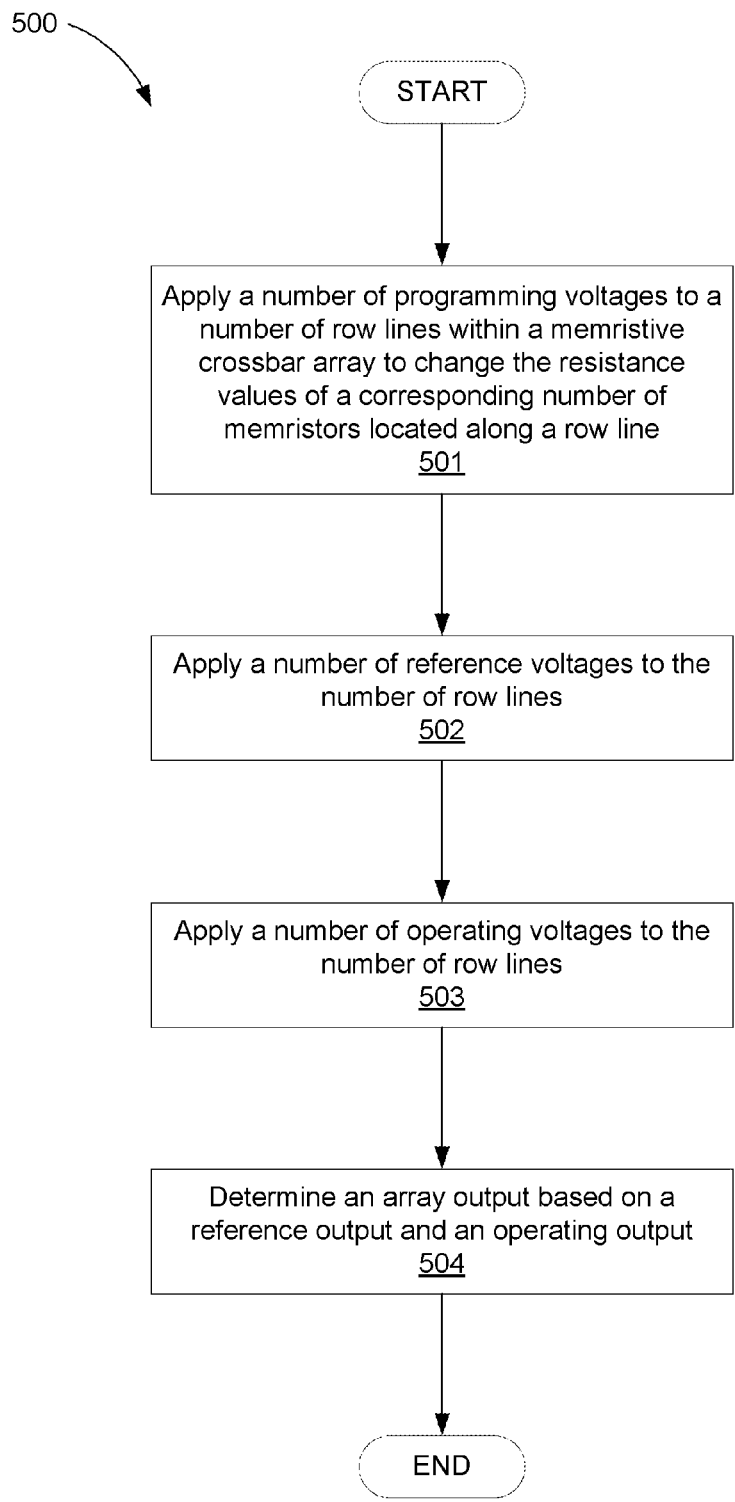
FIG. 5 is a flowchart showing a method of obtaining a dot product using a memristive dot product engine (DPE) with a nulling amplifier, according to one example of the principles described herein.

FIG. 5 is a flowchart showing a method (500) of obtaining a dot product using a memristive dot product engine (FIG. 1, 110) with a nulling amplifier (FIG. 3, 332), according to one example of the principles described herein. The method (500) includes applying (block 501) a number of programming voltages to a number of row lines (FIG. 2, 214) within a memristive crossbar array (FIG. 2, 212). The programming voltage changes the resistance values of a corresponding number of memristors (FIG. 2, 220) located along a row line (FIG. 2, 214). The programming voltages are the program vector signals (FIG. 3, 326) described above that represent a corresponding number of values within a matrix, respectively. In this manner, a mathematical matrix is mapped to the memristive array (FIG. 2, 212), and is ready to be processed as a first set of values in a dot product mathematical process.

The method (500) also includes applying (block 502) a number of reference voltages to the number of row lines (FIG. 2, 214). The reference voltages are the reference vector signals (FIG. 3, 328) described above. As described above, due to the variations between resistance levels in the memristive crossbar array (FIG. 2, 212) (for example, routinely on the order of a factor of 1,000 ohms), and due to the small differences between operating vector signals (FIG. 3, 330), the reference voltage may be used to determine a reference output (FIG. 3, 334), which reference output (FIG. 3, 334) may be used to bring the array output (FIG. 4, 446) into a more useful range.

The method (500) also includes applying (block 503) a number of operating voltages to the number of row lines (FIG. 2, 214). The operating voltages are the operating vector signals (FIG. 3, 330) described above that represent a number of vector values to be multiplied by the matrix values programmed into the memristors (FIG. 2, 220) to obtain a dot product. When the operating voltages are applied to the memristors (FIG. 2, 220) of the memristive array (FIG. 2, 212), the memristors (FIG. 2, 220) see a voltage input (Vin$_1$, Vin$_2$, ..., Vin$_n$) that causes a current to run through the memristor (FIG. 2, 220). The current level running through the memristor (FIG. 2, 220) is the value of the voltage input (Vin$_1$, Vin$_2$, ..., Vin$_n$) multiplied by the resistance of the memristor (FIG. 2, 220); the resistance of the memristor (FIG. 2, 220) being represented by the programming voltage that changed the resistance value of the memristor (FIG. 2, 220). The operating voltages act as read signals. The operating voltages are relatively smaller than the programming voltages used to program the memristors (FIG. 2, 220) such that the operating voltages do not change the resistance values of the memristors (FIG. 2, 220) as programmed by the programming voltages.

In this manner, the current obtained from the individual memristors (FIG. 2, 220) through the application of the operating voltages is equal to the multiplication of the matrix value obtained by the programming voltages at the respective memristor (FIG. 2, 220) with the vector values obtained by the operating voltages at the respective memristor (FIG. 2, 220).

The method (500) may include determining (block 504) an array output (FIG. 4, 446) based on a reference output (FIG. 3, 334) and an operating output (FIG. 3, 336). As described above, the reference output (FIG. 3, 334) may be obtained from the memristors (FIG. 2, 220) in a column line (FIG. 2, 216) by multiplying the reference voltage by the resistance of the memristor (FIG. 2, 220). Similarly, the operating output (FIG. 3, 336) may be obtained from the memristors (FIG. 2, 220) in a column line (FIG. 2, 216) by multiplying the operating voltage by the resistance of the memristor (FIG. 2, 220).

In determining (block 504) the array output (FIG. 4, 446), a column output (FIG. 4, 444) of each column line (FIG. 2, 216) may be determined by subtracting the reference output (FIG. 3, 334) (i.e., reference voltage or reference current) from the operating output (FIG. 3, 336) (i.e., operating voltage or operating current). Determining (block 504) the array output (FIG. 4, 446) may include combining all the column outputs (FIG. 4, 444-1, 444-2, 444-3), be they reference voltages or reference currents, and combining the column outputs (FIG. 4, 444) into a vector to represent the dot product. As depicted in FIGS. 4A and 4B, column outputs (FIG. 4, 444) as collected by the column lines (FIG. 2, 216) may be further collected into an array output (FIG. 4, 446).

In order to represent a new mathematical matrix and vector, the process of FIG. 5 may loop back to block 501 in which a number of new programming voltages are applied (block 501) to a corresponding number of row lines (FIG. 2, 214) within the memristive array (FIG. 2, 212) to change the resistance values of a corresponding number of memristors (FIG. 2, 220). In this manner, new resistance values are programmed into the memristors (FIG. 2, 220) of the memristive crossbar array (FIG. 2, 212) that represent the new mathematical matrix. The method may continue to blocks 502, 503, and 504 as described above.

In some examples a number of operations described in the method (500) may be performed as the memristive DPE with nulling amplifier (FIG. 1, 110) is in different operating modes. For example, applying (block 502) a number of reference voltages to the number of row lines (FIG. 2, 214) may occur in a training mode. By comparison, applying (block 503) a number of operating voltages and determining (block 504) an array output (FIG. 4, 446) based on the reference output (FIG. 3, 334) and operating output (FIG. 3, 336) may be performed during an operational mode. In this example, the memristive DPE (FIG. 1, 110) may include a trigger, such as a transistor, that indicates the DPE (FIG. 1, 110) is in a training mode; during which reference outputs (FIG. 3, 334) are to be received and stored. The trigger may also indicate that the DPE (FIG. 1, 110) is in an operational mode; during which operating outputs (FIG. 3, 336) are to be received, reference outputs (FIG. 3, 334) are to be called, and the nulling amplifiers (FIG. 3, 332) are to be used to determine an array output (FIG. 4, 446).

Figure 6:
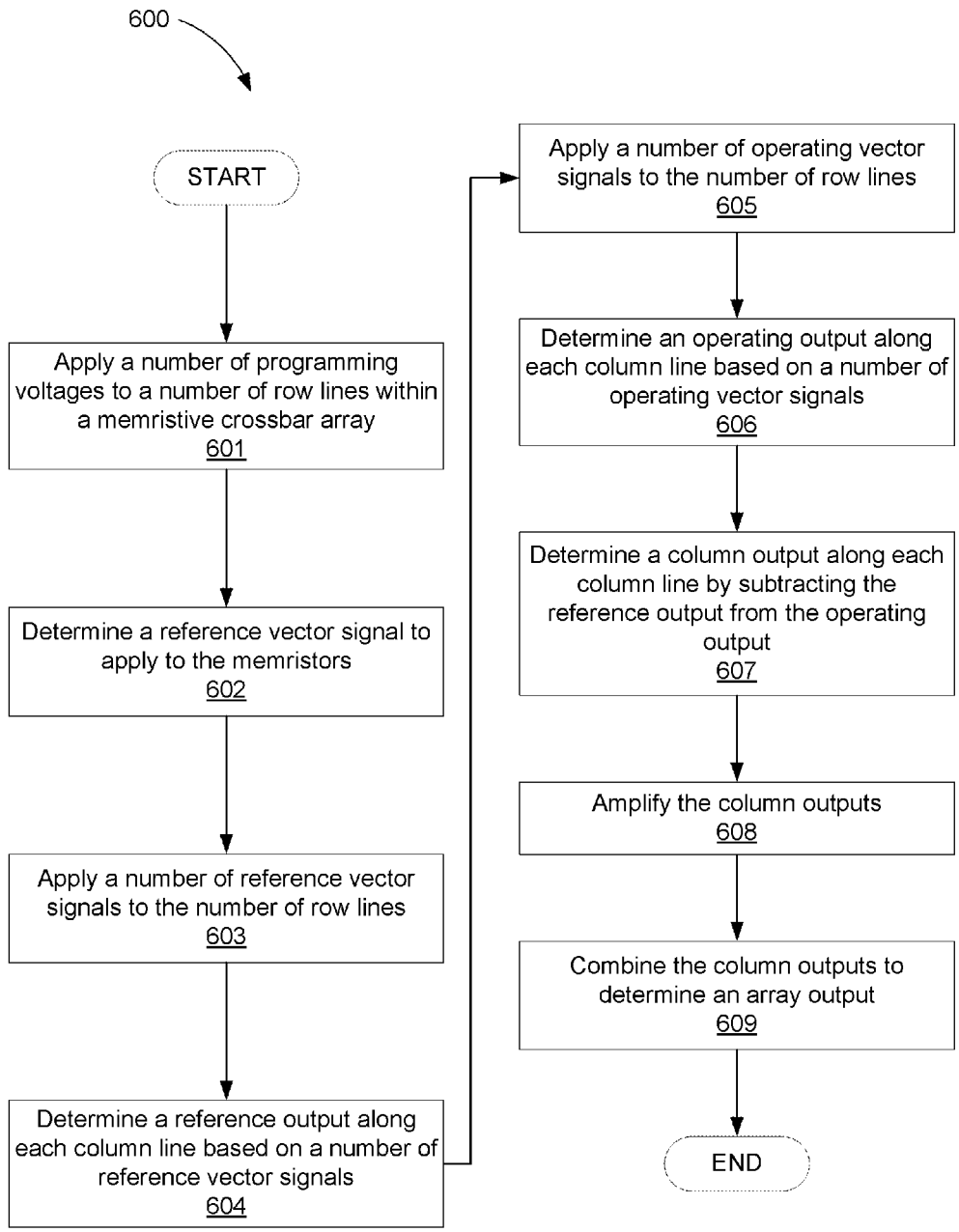
FIG. 6 is a flowchart showing a method of obtaining a dot product using a memristive dot product engine (DPE) with a nulling amplifier, according to another example of the principles described herein.

FIG. 6 is a flowchart showing a method (600) of obtaining a dot product using a memristive dot product engine (FIG. 1, 110) with a nulling amplifier (FIG. 3, 332), according to another example of the principles described herein. The method (600) includes applying (block 601) a number of programming vector signals (FIG. 3, 326) to a number of row lines (FIG. 2, 214) within a memristive crossbar array (FIG. 2, 212). This may be performed as described above in connection with FIG. 5.

The method (600) includes determining (block 602) a reference vector signal (FIG. 3, 328) to apply to the memristors (FIG. 2, 220). For example, a statistical analysis of the intended operating vector signals (FIG. 3, 330) may be performed to select a reference vector signal (FIG. 3, 328) that is likely to yield the most efficient array output (FIG. 4, 446). This may be a simple uniform distribution analysis. While specific reference is made to a statistical analysis and a uniform distribution analysis, any type of criteria may be used to determine (block 602) the reference vector signal (FIG. 3, 328), including user preference.

The method (600) includes applying (block 603) a number of reference vector signals (FIG. 3, 328) to the number of row lines (FIG. 2, 214). This may be performed as described in connection with FIG. 5.

The method (600) includes determining (block 604) a reference output (FIG. 3, 334) along each column line (FIG. 2, 216) based on a number of reference vector signals (FIG. 3, 328). This may be performed by multiplying each memristor (FIG. 2, 220) resistance value (as a conductance for example) by a reference vector signal (FIG. 3, 328) applied to a row line (FIG. 2, 214) that corresponds to that memristor (FIG. 2, 220). For example, for a memristor (FIG. 2, 220) located along the first row line (FIG. 2, 214), the conductance of that memristor (FIG. 2, 220) may be multiplied by the reference vector signal (FIG. 3, 328) applied to the row line (FIG. 2, 214). Such a multiplication may result in an output current value for that memristor (FIG. 2, 220). The output current values for memristors (FIG. 2, 220) in a particular column line (FIG. 2, 216) may be summed to generate a reference output (FIG. 3, 334) for the column line (FIG. 2, 216). The reference output (FIG. 3, 334) may be a reference current, or may be passed through a TIA (FIG. 4, 440) to generate a reference voltage. The reference output (FIG. 3, 334) may then be stored in a storage component (FIG. 4, 438) until subsequent use in an operating mode when an operating output (FIG. 3, 336) is received.

The method (600) includes applying (block 605) a number of operating vector signals (FIG. 3, 330) to the number of row lines (FIG. 2, 214). This may be performed as described in connection with FIG. 5.

The method (600) includes determining (block 606) an operating output (FIG. 3, 336) along each column line (FIG. 2, 216) based on a number of operating vector signals (FIG. 3, 330). This may be performed by multiplying each memristor (FIG. 2, 220) conductance value by an operating vector signal (FIG. 3, 330) applied to a row line (FIG. 2, 214) that corresponds to that memristor (FIG. 2, 220). For example, for a memristor (FIG. 2, 220) located along the first row line (FIG. 2, 214), the conductance of that memristor (FIG. 2, 220) may be multiplied by the operating vector signal (FIG. 3, 330) applied to the row line (FIG. 2, 214). Such a multiplication may result in an output current value for that memristor (FIG. 2, 220). The output current values for memristors (FIG. 2, 220) in a particular column line (FIG. 2, 216) may be summed to generate an operating output (FIG. 3, 336) for the column line (FIG. 2, 216). The operating output (FIG. 3, 33628) may be an operating current, or may be passed through a TIA (FIG. 4, 440) to generate an operating voltage.

The method (600) includes determining (block 607) a column output (FIG. 4, 444) along each column line (FIG. 2, 216) by subtracting the reference output (FIG. 3, 334) from the operating output (FIG. 3, 336). This may include calling the reference output (FIG. 3, 334) from the storage component (FIG. 4, 438) and then generating a summed signal that represents a column output (FIG. 4, 444) from each column line (FIG. 2, 216). In some examples, determining (block 607) a column output (FIG. 4, 444) may include amplifying the column output (FIG. 4, 444) into a desired range. For example, the column output (FIG. 4, 444) may be amplified to bring the column output (FIG. 4, 444) above a noise threshold to generate an output with a better signal to noise ratio. In some examples, the calculation of sums and products of the dot product are performed simultaneously by the memristive DPE (FIG. 1, 110).

The method (600) includes amplifying (block 608) the column outputs (FIG. 4, 444). For example, the memristive DPE (FIG. 1, 110) may further include a number of column amplifiers (FIG. 4, 450) to amplify the column outputs (FIG. 4, 444) into a range that is more desirable or more efficient for subsequent use.

The method (600) includes combining (block 609) the column outputs (FIG. 4, 444) to determine an array output (FIG. 4, 446). Combining (block 609) the column outputs (FIG. 4, 444) may include combining the column outputs (FIG. 4, 444) into a vector to represent the dot product of a matrix with an input vector. In another example, combining (block 609) the column outputs (FIG. 4, 444) may include summing the values to generate a scalar value representative of the dot product.

Aspects of the present system and method are described herein with reference to flowchart illustrations and/or block diagrams of methods, apparatus (systems) and computer program products according to examples of the principles described herein. Each block of the flowchart illustrations and block diagrams, and combinations of blocks in the flowchart illustrations and block diagrams, may be implemented by computer usable program code. The computer usable program code may be provided to a processor of a general purpose computer, special purpose computer, or other programmable data processing apparatus to produce a machine, such that the computer usable program code, when executed via, for example, the processor (FIG. 1, 101) of the computing system (FIG. 1, 100) or other programmable data processing apparatus, implement the functions or acts specified in the flowchart and/or block diagram block or blocks. In one example, the computer usable program code may be embodied within a computer readable storage medium; the computer readable storage medium being part of the computer program product. In one example, the computer readable storage medium is a non-transitory computer readable medium.

This memristive DPE (FIG. 1, 110) including a memristive crossbar array (FIG. 2, 212) for determining a dot product may have a number of advantages, including: (1) faster processing and more energy efficient of a dot product calculation relative to other DPEs that do not use memristors (FIG. 2, 220) or nulling amplifiers (FIG. 3, 332); (2) operation of the DPE having a nulling amplifier (FIG. 3, 332) that accounts for identified responses of the memristive crossbar array (FIG. 2, 212) to provide better signal-to-noise ratio and noise margins; and (3) allowing high dynamic range and high bit resolution array outputs (FIG. 4, 446).

The preceding description has been presented to illustrate and describe examples of the principles described. This description is not intended to be exhaustive or to limit these principles to any precise form disclosed. Many modifications and variations are possible in light of the above teaching.

What is claimed is:

1. A memristive dot product engine with a nulling amplifier, comprising:
a number of row lines;
a number of column lines intersecting the row lines, a memristive memory element located at each intersection of a row line and a column line, in which each memristive memory element receives:
a programming vector signal to represent a number of values within a matrix;
a reference vector signal; and
an operating vector signal to represent a number of vector values to be multiplied by the matrix; and
a nulling amplifier to determine an array output from:
a reference output which is based on the reference vector signal; and
an operating output which is based on the operating vector signal;
the array output representing a dot product of the matrix values and the vector values.

2. The engine of claim 1, in which:
the reference output is a reference voltage;
the operating output is an operating voltage; and
the nulling amplifier subtracts the reference voltage from the operating voltage.

3. The engine of claim 1, in which:
the reference output is a reference current;
the operating output is an operating current; and
the nulling amplifier subtracts the reference current from the operating current.

4. The engine of claim 1, further comprising a number of row circuits connected to each row line to apply the programming vector signal, reference vector signal, and operating vector signal to a number of corresponding memristive memory elements.

5. The engine of claim 1, further comprising a number of column circuits connected to each column line to receive the reference output and the operating output from a number of corresponding memristive memory elements.

6. The engine of claim 1, wherein the nulling amplifier comprises a separate nulling amplifier connected to each column line.

7. The engine of claim 1, wherein the nulling amplifier comprises a storage component to provide the reference output.

8. The engine of claim 1, further comprising an additional amplifier to amplify an output of the nulling amplifier.

9. The engine of claim 1, wherein the nulling amplifier comprises a transimpedance amplifier to output the operating output as a voltage to an additional amplifier that is to also receive the reference output and produce the array output.

10. A method of obtaining a dot product using a memristive dot product engine with a nulling amplifier, the method comprising:
applying a number of programming voltages to a number of row lines within a memristive crossbar array to change the resistance values of a corresponding number of memristors located at intersections between the row lines and a number of column lines;
applying a number of reference voltages to the number of the row lines;
applying a number of operating voltages to the number of the row lines, the operating voltages representing a corresponding number of vector values; and,
with the nulling amplifier, determining an array output based on a reference output and an operating output collected from the number of column lines.

11. The method of claim 10, further comprising amplifying the array output.

12. The method of claim 10, in which determining an array output further comprises:
determining a reference output along each column line based on the number of reference voltages;
determining an operating output along each column line based on the number of operating voltages;
determine a column output along each column by subtracting the reference output from the operating output.

13. The method of claim 12, further comprising combining the column outputs to determine an array output.

14. The method of claim 10, further comprising determining a reference voltage to apply to the memristive memory elements based on a statistical determination.

15. The method of claim 10, in which:
applying a number of reference voltages occurs in a training mode; and
applying a number of operating voltages occurs in an operational mode.

16. The method of claim 10, further comprising before applying the number of operating voltages to the number of the row lines, the operating voltages representing a corresponding number of vector values, using a scalar to make all the vector values positive.

17. A computing device for determining a dot product using a memristive crossbar array with a nulling amplifier, comprising:
a processor; and
a memristive crossbar array coupled to the processor, the memristive crossbar array comprising:
a number of row lines;
a number of column lines intersecting the row lines, a memristive memory element located at each intersection of a row line and a column line, in which each memristive element receives:
a programming vector signal to represent a value within a matrix;
a reference vector signal; and
an operating vector signal to represent a vector value to be multiplied by the matrix; and
a nulling amplifier to:
determine a reference output along each column line based on a number of reference vector signals;
determine an operating output along each column line based on a number of operating vector signals; and
determine an array output by subtracting the reference output from the operating output.

18. The computing device of claim 17, further comprising a number of column amplifiers to amplify a number of column outputs.

19. The computing device of claim 17, further comprising a storage component to store the reference output.

20. The computing device of claim 17, in which the calculation of sums and products of the dot product are performed simultaneously by the memristive crossbar array.

* * * * *